(12) United States Patent
Tseng et al.

(10) Patent No.: US 7,184,422 B2
(45) Date of Patent: Feb. 27, 2007

(54) ACCESS POINT HAVING A VARIETY OF MOUNTING POSITIONS

(75) Inventors: Shih-Chin Tseng, Taipei Hsien (TW); An-Ping Yang, Shanghai (CN)

(73) Assignee: Inventec Appliances Corp., Taipei (TW)

( * ) Notice: Subject to any disclaimer, the term of this patent is extended or adjusted under 35 U.S.C. 154(b) by 978 days.

(21) Appl. No.: 10/064,467

(22) Filed: Jul. 17, 2002

(65) Prior Publication Data

US 2004/0013098 A1   Jan. 22, 2004

(51) Int. Cl.
*H04Q 7/24* (2006.01)
(52) U.S. Cl. .................. 370/338; 455/575.1; 455/90.3; 455/128; 455/347

(58) Field of Classification Search ..................... None
See application file for complete search history.

(56) References Cited

U.S. PATENT DOCUMENTS 6,475,022 B2 * 11/2002 Tomino et al. ............. 439/449
6,735,450 B1 *  5/2004 Remmert .................. 455/550.1

* cited by examiner

*Primary Examiner*—Frank Duong
(74) *Attorney, Agent, or Firm*—Winston Hsu

(57) ABSTRACT

An access point includes a housing, two sliding slots, and two sliding plates detachably installed on the slide slots. One of the sliding slots has two openings for hanging the housing of the access point on hooks positioned on a wall. One of the sliding plates can be inserted into a concave slot on the housing, so that the housing can stand vertically on a flat surface. The housing can also be placed on a flat surface or set on its side.

13 Claims, 7 Drawing Sheets

ACCESS POINT HAVING A VARIETY OF MOUNTING POSITIONS

BACKGROUND OF INVENTION

1. Field of the Invention

The invention relates to an access point for a wireless local area network, and more particularly, to an access point that can be mounted on a flat surface or on a wall.

2. Description of the Prior Art

Computer networks enable people to conveniently transmit, receive, and share all kinds of data and information with each other. Furthermore, recently developed wireless computer networks eliminate the restriction of wires, and allow people to be on-line as long as they are within a service range. Wireless computer networks also spur the development of many portable products such as portable computers, PDAs, and cellular phones. With wireless networks, people can transmit data and messages and communicate with each other making their lives more convenient and flexible.

In a wired network, data is transmitted by network transmission lines. Wireless networks do not utilize network transmission lines as data is transmitted and received wirelessly. A wireless network utilizes an access point for receiving and transmitting signals. Since the signals in a wireless network are transmitted wirelessly, the signals are exposed and can be easily intercepted. To avoid data from being stolen, the data must be encrypted appropriately before being transmitted. To achieve this purpose, a key ID must be available at every access point and every terminal of the wireless local area network for encrypting and decrypting the transmitted data. Since different local area networks have different key IDs and key IDs are secured, transmitted data cannot be stolen by terminals located in different local area networks.

Additionally, a wireless network can connect with a wired network using a network transmission line, which is connected to the access point of the wireless network. Therefore, data can be transmitted between the wireless and the wired network through the access point.

As mentioned above, the access point plays an important role in a wireless network. The prior art access point is generally placed on a table or a flat surface, and communicates data from an antenna set located on top. However, the prior art access point has no alternate placement because of the limitation of the design of its external shape. Therefore, when the surrounding environment changes, it is difficult for the prior art access point to be placed appropriately to adapt to the new environment. Users can add extra devices or connectors to help this situation, however, these extra devices or connectors make the product more complicated and add to production costs and time. Therefore, there are still some problems to be solved with the prior art access point.

SUMMARY OF INVENTION

It is therefore a primary objective of the claimed invention to solve the above-mentioned problems by providing a wireless network access point that can be easily positioned horizontally, vertically, or laterally, and hung on a wall.

Briefly summarized, the claimed invention includes a housing having a first sliding slot formed on an upper side of the housing. The first sliding slot has at least one opening for hanging the housing on hooks positioned on a wall. A first sliding plate is detachably installed in the first sliding slot. The first sliding plate includes two protruding portions formed on a front surface of the first sliding plate, and when the first sliding plate is slid into the first sliding slot, the housing is capable of being placed on a flat surface using the first sliding plate.

According to the claimed invention, a concave slot is formed on a rear side of the housing for engaging with the two protruding portions. After the two protruding portions are inserted into the concave slot, the access point is capable of being positioned vertically on the flat surface through the first sliding plate. The first sliding plate includes a plurality of feet installed on an inner side of the first sliding plate. After the first sliding plate is slid out from the sliding slot, the feet can be spread out to increase a contact area between the first sliding plate and the flat surface.

According to the claimed invention, a second sliding plate is detachably installed on a second sliding slot positioned on a lower side of the housing. The second sliding plate has two protruding portions formed on a surface of the second sliding plate. After the second sliding plate is slid into the second sliding slot, the housing is capable of being placed on the flat surface using the second sliding plate. A side-foot is installed on a side of the housing for allowing the access point to be positioned vertically on the side.

It is an advantage of the claimed invention that the sliding plates, sliding slots, the opening for hanging the housing, and the side-foot provide numerous placement configurations for the access point.

These and other objectives of the claimed invention will no doubt become obvious to those of ordinary skill in the art after reading the following detailed description of the preferred embodiment that is illustrated in the various figures and drawings.

DETAILED DESCRIPTION

The present invention provides an access point that can be placed in a variety of ways, such as positioned horizontally, vertically, or laterally, or hung on a wall.

Figure 1:
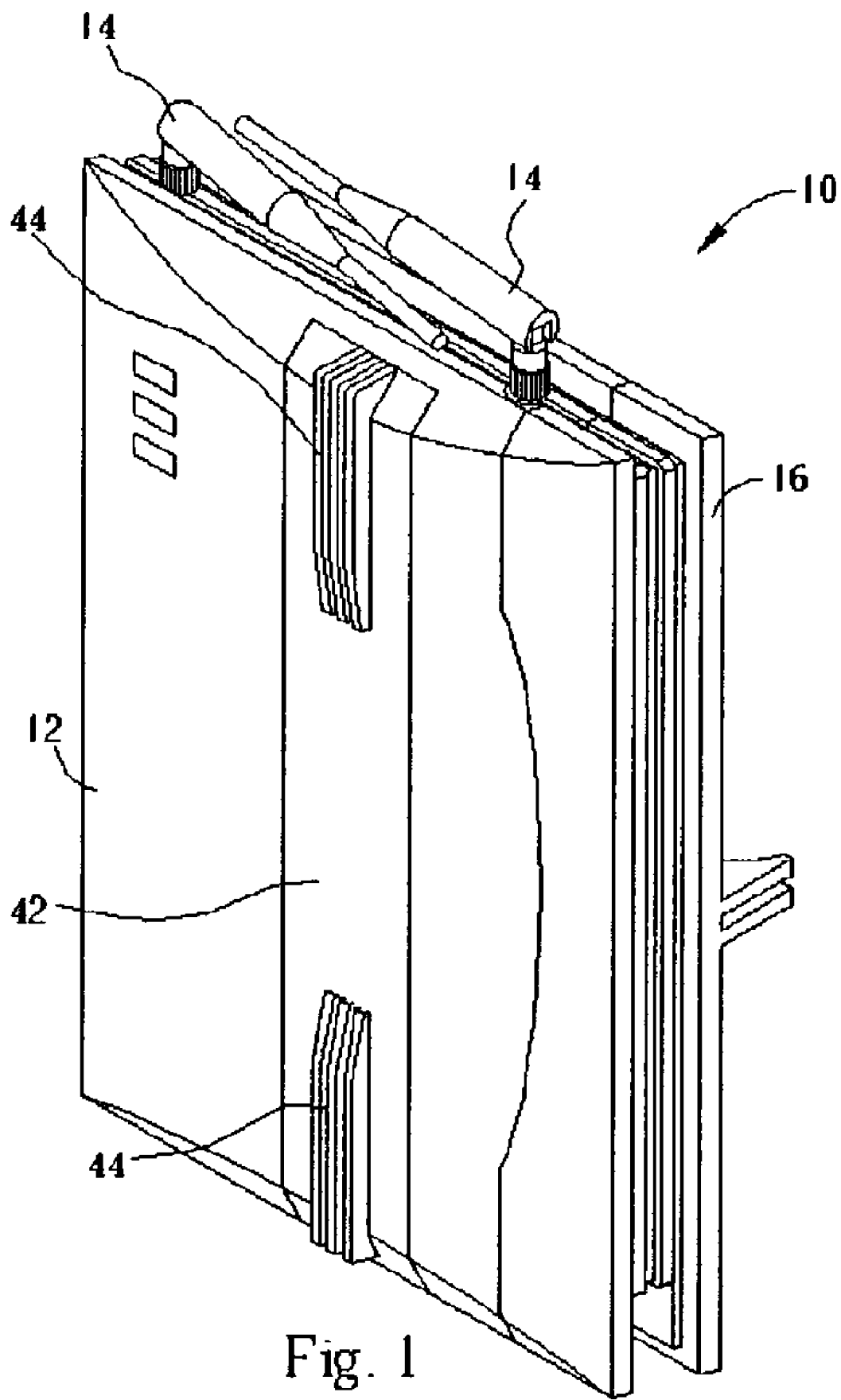
FIG. 1 is a perspective view of an access point according to the present invention.
Figure 2:
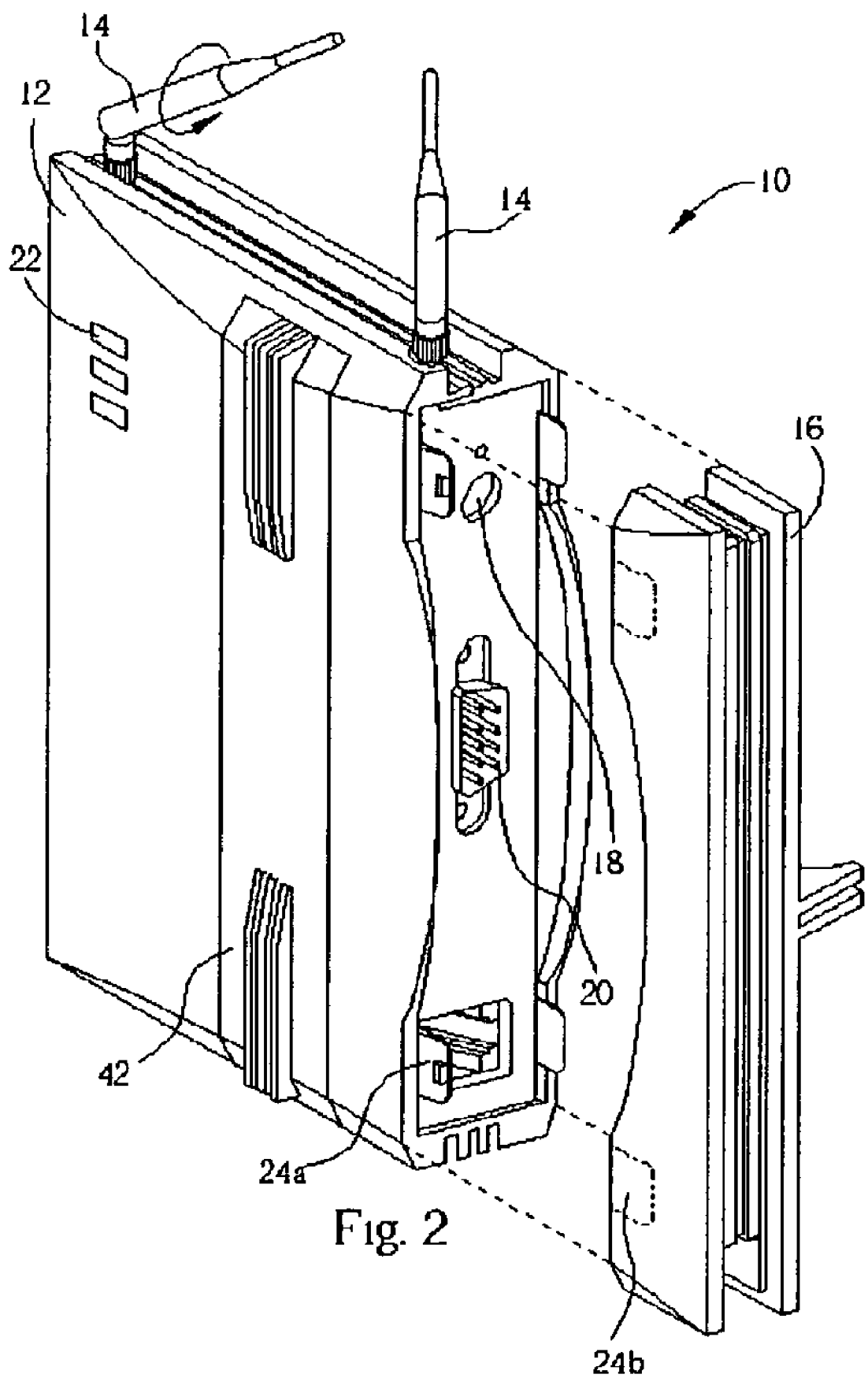
FIG. 2 shows the access point of FIG. 1 positioned horizontally.

Please refer to FIG. 1 and FIG. 2. FIG. 1 is a perspective view of an access point 10 according to the present invention. FIG. 2 shows the access point 10 positioned horizontally. The access point 10 comprises a housing 12, two antennas 14, and a lateral housing 16. Included in the housing 12 are a power port 18, a transmission port 20, and at least one indicator light 22. The power port 18 is located on a side of the access point 10 and is utilized for connecting with an external power supply to provide electrical power to the access point 10. The transmission port 20 is located adjacent to the power port 18 and also on the side of the access point 10. The transmission port 20 is for connecting to a wired local area network so as to establish a data path between the wired and wireless local area networks. The indicator light 22 is disposed on a surface of the housing 12 and is utilized for indicating the operation condition of the access point 10. The indicator light 22 can indicate if the access point 10 is powered-on or if the transmission port 20 is transmitting data.

The two antennas 14 of the access point 10 are disposed at corners of the housing 12. When the access point 10 is off then the antennas 14 can be folded, as shown in FIG. 1. When the access point 10 is in normal operation, the antennas 14 can be spread out and freely rotated, as shown in FIG. 2, to conveniently adjust the antennas 14 to the best position for transmitting and receiving signals. Though there are two antennas 14 in the present invention, one antenna 14 is also practical. Two antennas 14 are typically used to allow for selecting an adequately strong signal. The lateral housing 16 is disposed on the side of the housing 12 in a detachable manner, and shields the power port 18 and the transmission port 20. The housing 12 has at least a hook 24a, and the lateral housing 16 has at least a corresponding hook receiver 24b. When the hook 24a is connected with the hook receiver 24b, the lateral housing 16 is attached to the housing 12.

Figure 3:
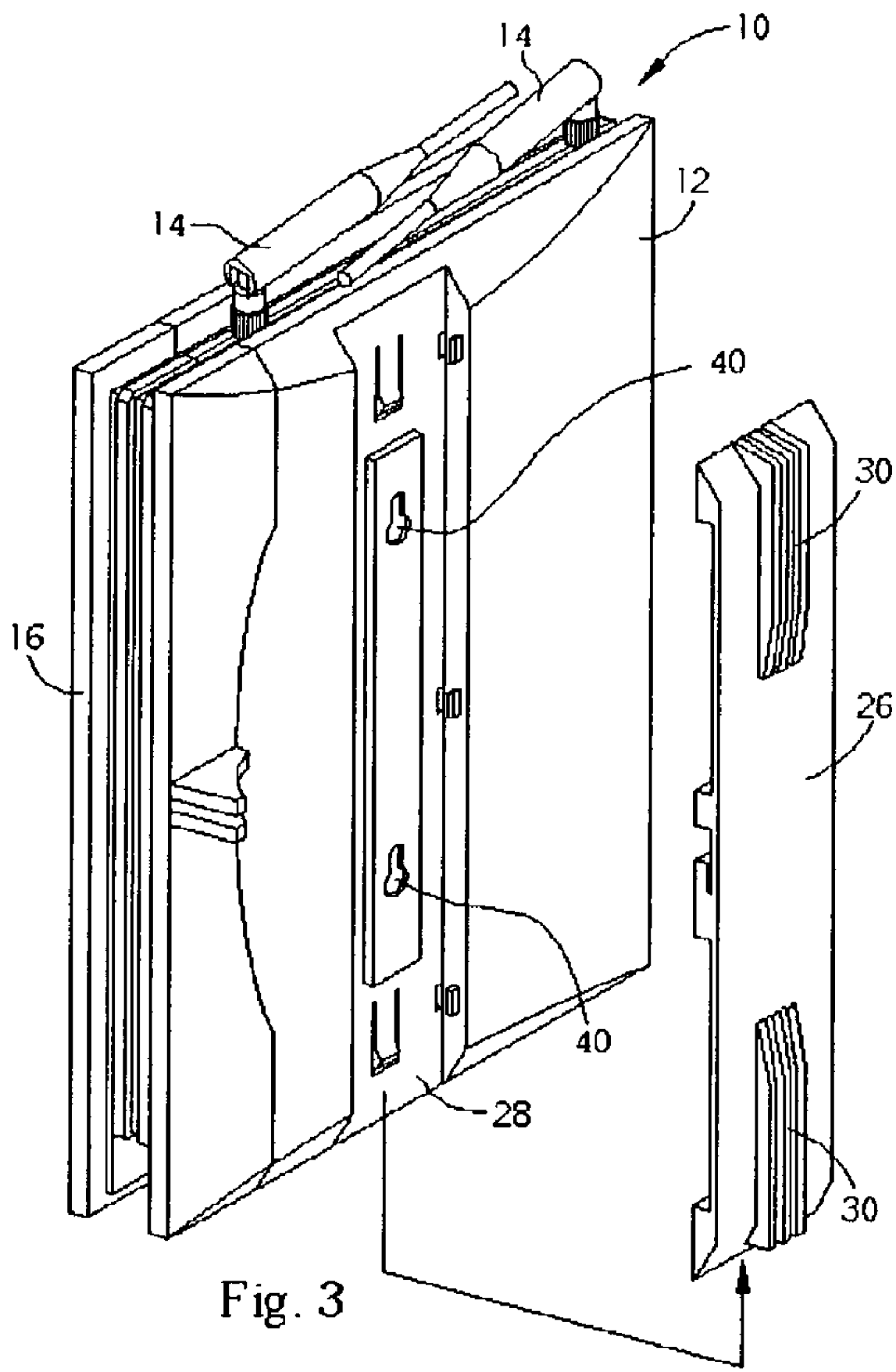
FIG. 3 is a rear-view of the housing of FIG. 1 and a first sliding plate according to the present invention.
Figure 4:
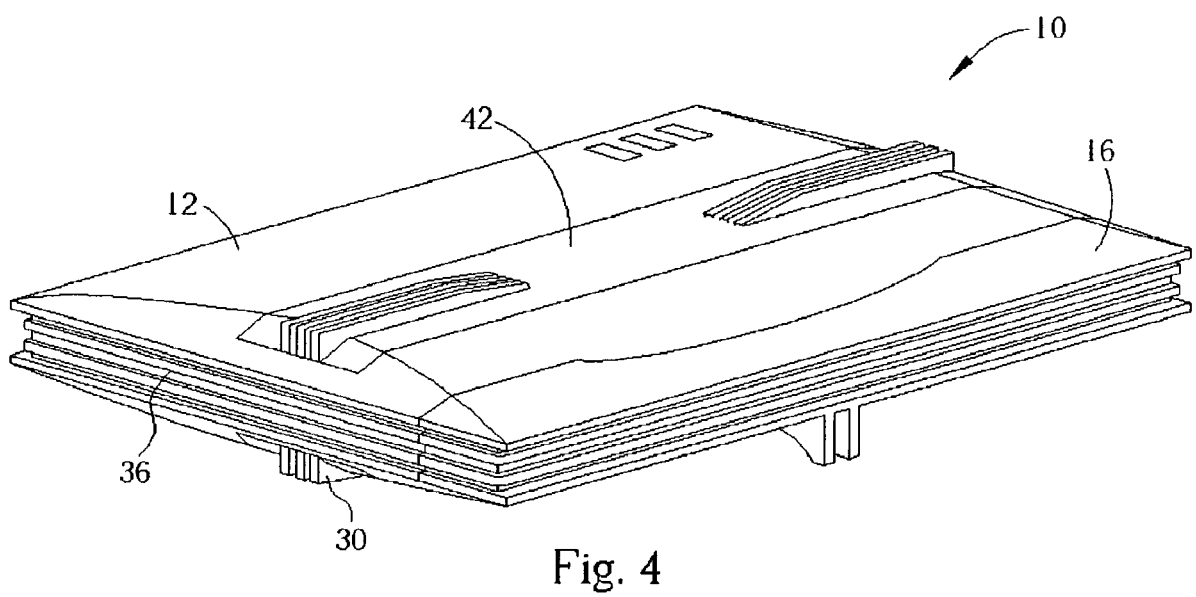
FIG. 4 is a perspective view of the access point of FIG. 1 placed on a flat surface.

Please refer to FIG. 3 and FIG. 4. FIG. 3 is a rear-view of the housing 12. FIG. 4 is a perspective view of the access point 10 placed on a flat surface. The access point 10 further comprises a first sliding plate 26 detachably disposed on a rear slot 28 of the housing 12. Two protruding portions 30 are formed on a surface of the first sliding plate 26 and form a surface themselves. Therefore, when the two protruding portions 30 are fixed at the rear-side of the housing 12, the access point 10 can be steadily placed on a desk, as shown in FIG. 4.

Figure 5:
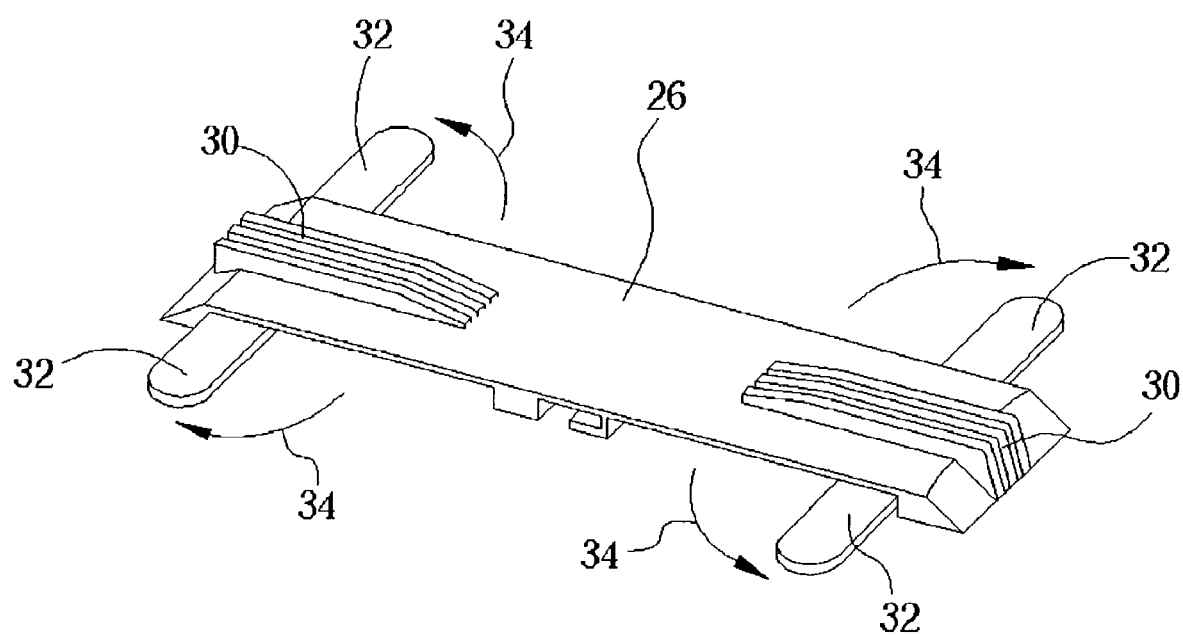
FIG. 5 is a perspective view of the first sliding plate of FIG. 3.
Figure 6:
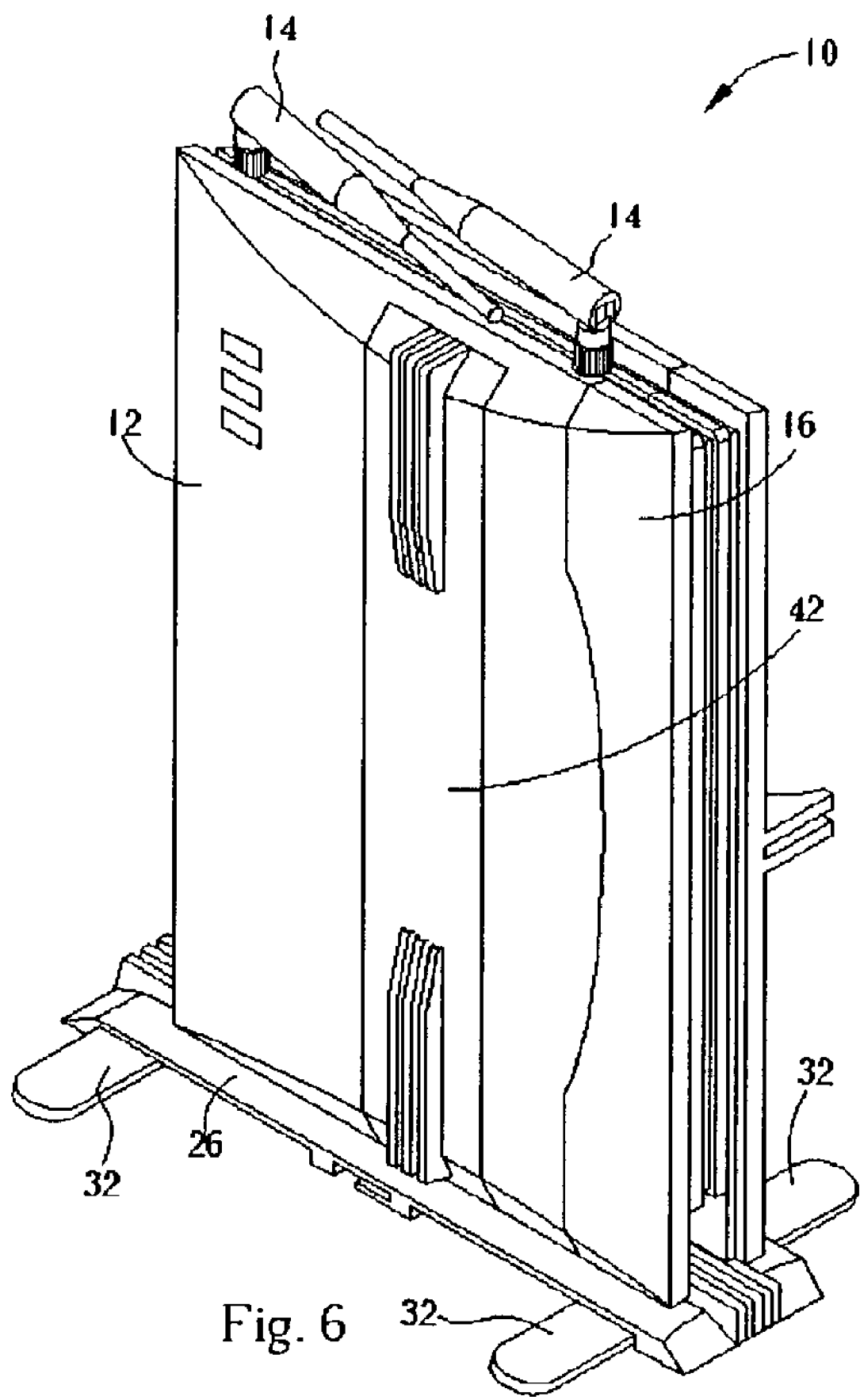
FIG. 6 is a perspective view of the access point of FIG. 1 positioned vertically.

Please refer to FIG. 5 and FIG. 6. FIG. 5 is a perspective view of the first sliding plate 26 of the access point 10. FIG. 6 is a perspective view of the access point 10 positioned vertically on a flat surface. A plurality of feet 32 is installed on an inner side of the first sliding plate 26. There are four feet 32 in preferred embodiment of the present invention. When the first plate 26 slides out from the sliding slot 28, the feet 32 are capable of spreading out and forming a surface to be placed on the flat surface, as the arrows 34 indicate in FIG. 5. Additionally, the bottom of the housing 12 comprises a concave slot 36 corresponding to the protruding portion 30 of the first sliding plate 26. The protruding portion 30 can be vertically inserted into the concave slot 36 of the housing 12. Since the concave slot 36 and the protruding portion 30 are attached tightly, the housing 12 is steadily fixed by the first sliding plate 26 by inserting the protruding portion 30 into the concave slot 36, as shown in FIG. 6. Therefore, the access point 10 can be positioned vertically on the flat surface of a desk by the innovative design of the first sliding plate 26 to meet any individual's demand. Furthermore, the four feet 32 are capable of spreading out so as to increase contact area between the first sliding plate 26 and the desk while the access point 10 is positioned vertically.

Figure 7:
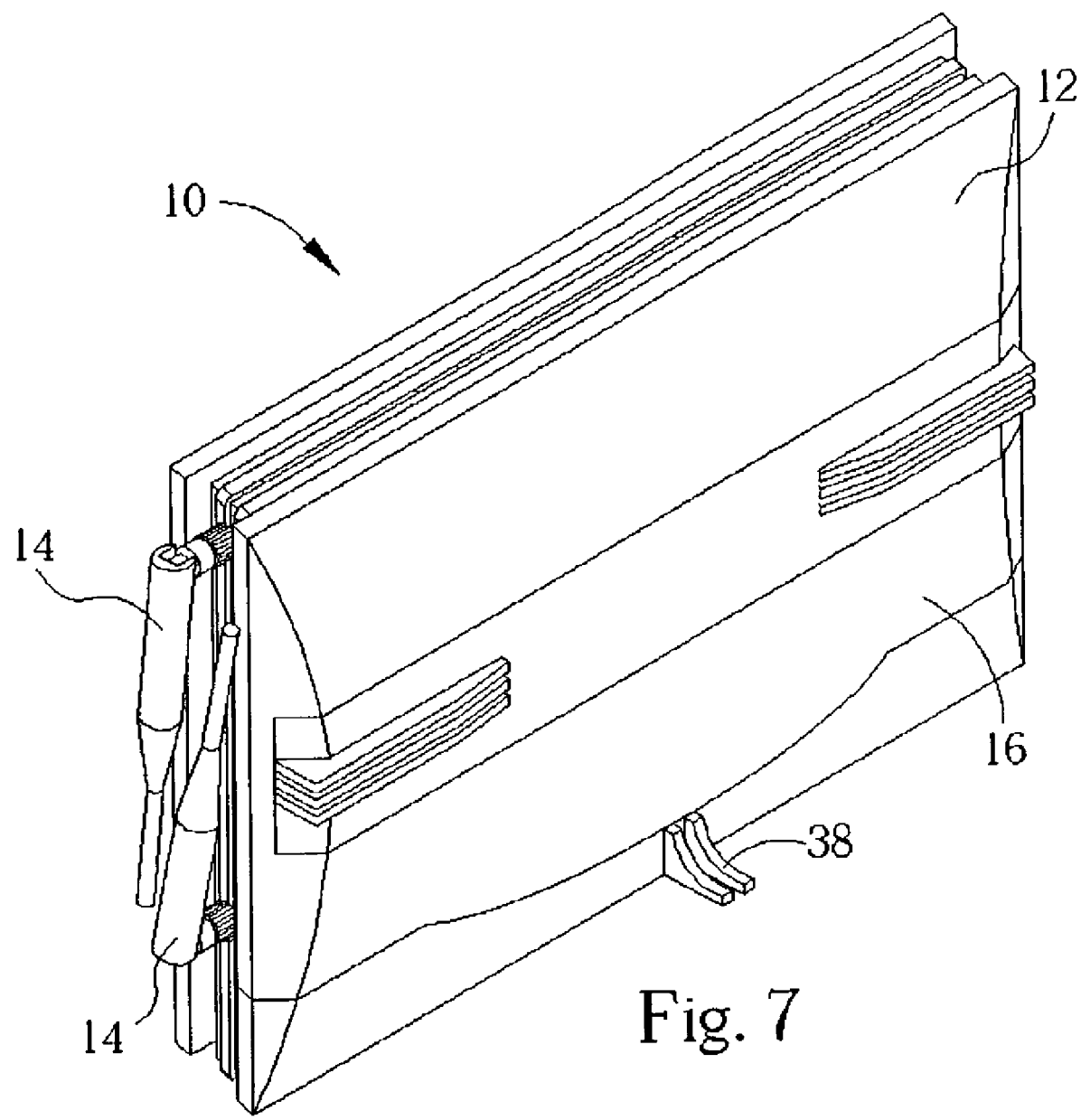
FIG. 7 is a perspective view of the access point of FIG. 1 placed with its lateral side on a desk.

Please refer to FIG. 7, which is a perspective view of the present invention access point 10 positioned vertically on a side on the surface of the desk. A protruding side-foot 38 is disposed on the lateral housing 16 of the access point 10 to allow the access point 10 to stand vertically with its side on the flat surface. This is an alternative manner of placing the access point 10.

Please refer to FIG. 1. The access point 10 further comprises a second sliding plate 42 detachably installed on a front-side sliding slot of the housing 12. The structure of the second sliding plate 42 is identical to that of the first sliding plate 26. This means that the second sliding plate 42 also has two protruding portions 44 formed on a surface of the second sliding plate 42 and a plurality of (four in the preferred embodiment) feet formed on a bottom side. Undoubtedly, the two protruding portions 44 of the second sliding plate 42 can also be attached with the concave slot 36. Therefore, when the second sliding plate 42 slides out of the front-side sliding slot, the protruding portions 44 can be vertically inserted into the concave slot 36 formed on the bottom of the housing 12. Meanwhile, the feet at the bottom of the second sliding plate 42 are capable of spreading out so as to increase contact area to allow the access point 10 to be positioned vertically on the desk.

The prior art access point can merely be placed flatly on the desk or on the flat surface, which simply cannot meet every individual's demand. Extra devices are required to make the access point capable of being positioned in other manners, which makes design and production much more complicated and increases costs. The present invention access point achieves several alternative manners of placement and fully satisfies a wide range of user demands.

Those skilled in the art will readily observe that numerous modifications and alternations of the device may be made while retaining the teachings of the invention. Accordingly, the above disclosure should be construed as limited only by the metes and bounds of the appended claims.

What is claimed is:

1. An access point for connecting a computer with a wireless network, the access point comprising:
   a housing having a first sliding slot formed on an upper side of the housing and a concave slot formed on a rear side of the housing, the first sliding slot having at least one opening for hanging the housing on hooks positioned on a wall; and
   a first sliding plate detachably installed in the first sliding slot, the first sliding plate comprising:
      two protruding portions formed on a front surface of the first sliding plate for engaging with the concave slot of the housing, wherein after the two protruding portions are inserted into the concave slot, the access point is capable of positioning vertically on the flat surface through the first sliding plate; and
      a plurality of feet installed on an inner side of the first sliding plate, and after the first sliding plate slides out from the sliding slot, the feet are capable of spreading out so as to increase a contact area between the first sliding plate and the flat surface while the access point is positioned vertically on the flat surface;
   wherein when the first sliding plate slides into the first sliding slot, the housing is capable of being placed on a flat surface using the first sliding plate.

2. The access point of claim 1 further comprising an antenna installed on a front side of the housing for transmitting and receiving wireless signals.

3. The access point of claim 1 being used to connect a wired local area network (LAN) to a wireless local area network.

4. The access point of claim 3 further comprising a wireless LAN card for connecting the access point to the wireless LAN.

5. The access point of claim 4 further comprising an output port for connecting the access point to the wired LAN.

6. The access point of claim 1 further comprising a second sliding plate detachably installed on a second sliding slot positioned on a lower side of the housing, wherein the second sliding plate has two protruding portions formed on a surface of the second sliding plate, and after the second sliding plate slides into the second sliding slot, the housing is capable of being placed on the flat surface using the second sliding plate.

7. The access point of claim 1 further comprising a side-foot installed on a side of the housing for allowing the access point to be positioned vertically on the side.

8. An access point for connecting a computer with a wireless network, the access point comprising:
- a housing having a first sliding slot formed on an upper side of the housing, the first sliding slot having at least one opening for hanging the housing on hooks positioned on a wall;
- a first sliding plate detachably installed in the first sliding slot; and
- a second sliding plate detachably installed on a second sliding slot positioned on a lower side of the housing, wherein the second sliding plate has two protruding portions formed on a surface of the second sliding plate, and after the second sliding plate slides into the second sliding slot, the housing is capable of being placed on the flat surface using the second sliding plate.

9. The access point of claim 8 Further comprising an antenna installed on a front side of the housing for transmitting and receiving wireless signals.

10. The access point of claim 8 being used to connect a wired local area network (LAN) to a wireless local area network.

11. The access point of claim 10 further comprising a wireless LAN card for connecting the access point to the wireless LAN.

12. The access point of claim 11 further comprising an output port for connecting the access point to the wired LAN.

13. The access point of claim 8 further comprising a side-foot installed on a side of the housing for allowing the access point to be positioned vertically on the side.

* * * * *